United States Patent
Gulba et al.

(10) Patent No.: US 8,219,331 B2
(45) Date of Patent: Jul. 10, 2012

(54) ELECTRONIC DEVICE AND METHOD FOR EVALUATING A VARIABLE CAPACITANCE

(75) Inventors: Thomas Gulba, Nuremberg (DE); Olaf Walter Escher, Denkendorf (DE)

(73) Assignee: Texas Instruments Deutschland GmbH, Freising (DE)

( * ) Notice: Subject to any disclaimer, the term of this patent is extended or adjusted under 35 U.S.C. 154(b) by 291 days.

(21) Appl. No.: 12/465,456

(22) Filed: May 13, 2009

(65) Prior Publication Data

US 2009/0295460 A1    Dec. 3, 2009

Related U.S. Application Data

(60) Provisional application No. 61/141,432, filed on Dec. 30, 2008.

(30) Foreign Application Priority Data

May 14, 2008 (DE) .......... 10 2008 023 535

(51) Int. Cl.
*G01F 1/00* (2006.01)
*G01R 7/00* (2006.01)

(52) U.S. Cl. ......... 702/47; 327/520; 73/514.32; 73/718; 702/52; 332/150; 331/36 C

(58) Field of Classification Search .............. 702/47, 702/52; 331/36 C; 327/520; 73/514.32, 73/718; 332/150

See application file for complete search history.

(56) References Cited

U.S. PATENT DOCUMENTS

| | | | | |
|---|---|---|---|---|
| 5,048,165 A | * | 9/1991 | Cadwell | 29/25.41 |
| 5,051,743 A | * | 9/1991 | Orszulak | 340/870.04 |
| 5,095,750 A | * | 3/1992 | Suzuki et al. | 73/514.19 |
| 5,194,819 A | * | 3/1993 | Briefer | 324/684 |
| 5,277,053 A | * | 1/1994 | McLane et al. | 73/1.38 |
| 5,417,312 A | * | 5/1995 | Tsuchitani et al. | 188/181 A |
| 5,454,266 A | * | 10/1995 | Chevroulet et al. | 73/514.18 |
| 5,511,420 A | * | 4/1996 | Zhao et al. | 73/514.18 |
| 5,597,956 A | * | 1/1997 | Ito et al. | 73/514.18 |
| 5,600,066 A | * | 2/1997 | Torregrosa | 73/514.18 |
| 5,637,798 A | * | 6/1997 | Schatz | 73/514.32 |
| 5,705,978 A | * | 1/1998 | Frick et al. | 340/511 |
| 6,296,779 B1 | * | 10/2001 | Clark et al. | 216/66 |
| 6,366,099 B1 | * | 4/2002 | Reddi | 324/678 |
| 6,586,943 B1 | * | 7/2003 | Masuda et al. | 324/500 |

(Continued)

FOREIGN PATENT DOCUMENTS

DE    42 44 739    10/1992

(Continued)

*Primary Examiner* — Arnold Kinkead
*Assistant Examiner* — Richard Tan
(74) *Attorney, Agent, or Firm* — John J. Patti; Wade J. Brady, III; Frederick J. Telecky, Jr.

(57) ABSTRACT

An apparatus is provided. The apparatus comprises a digital signal generator, an analog filter, an amplitude modulator, and an analog-to-digital converter (ADC). The digital signal generator has a demodulator and provides a digital excitation signal. The analog filter is coupled to the digital signal generator. The amplitude modulator has a variable capacitor and is coupled to the analog filter. The amplitude modulator also generates an amplitude modulated signal with an amplitude that is a function of the capacitance of the variable capacitor. The ADC is coupled to the amplitude modulator and the demodulator, and the digital signal generator and the demodulator operate synchronously.

17 Claims, 3 Drawing Sheets

U.S. PATENT DOCUMENTS

| | | | |
|---|---|---|---|
| 6,590,400 B2 * | 7/2003 | Hilliard et al. | 324/654 |
| 6,761,069 B2 * | 7/2004 | Hollocher et al. | 73/514.18 |
| 7,155,979 B2 * | 1/2007 | Lasalandra et al. | 73/514.18 |
| 7,454,967 B2 * | 11/2008 | Skurnik | 73/146.5 |
| 7,595,648 B2 * | 9/2009 | Ungaretti et al. | 324/678 |
| 7,614,300 B2 * | 11/2009 | Stewart et al. | 73/514.18 |
| 7,665,361 B2 * | 2/2010 | Miller et al. | 73/514.18 |
| 7,683,601 B2 * | 3/2010 | Bouyat | 324/71.1 |
| 2008/0088351 A1 * | 4/2008 | Kimura | 327/244 |

FOREIGN PATENT DOCUMENTS

| | | |
|---|---|---|
| EP | 0 745 861 | 5/1996 |
| WO | WO 2007/081472 | 7/2007 |

* cited by examiner

ELECTRONIC DEVICE AND METHOD FOR EVALUATING A VARIABLE CAPACITANCE

CROSS-REFERENCE TO RELATED APPLICATIONS

This application claims priority to German patent application No. 102008023535.0, entitled "ELECTRONIC DEVICE AND METHOD FOR EVALUATING A VARIABLE CAPACITANCE," filed on May 14, 2008, and U.S. Provisional Application No. 61/141,432, filed Dec. 30, 2008, which are hereby incorporated by reference for all purposes.

TECHNICAL FIELD

The invention relates generally to an electronic device for determining the value of a variable capacitance and, more particularly, to an electronic device and method for evaluating a variable capacitance and for digitizing the value of a capacitive pressure sensor.

BACKGROUND

Variable capacitances are often used in pressure sensors, for example. In such applications, it is required to determine the value of the variable capacitance. The pressure applied to the sensor changes the value of the variable capacitance, which allows for measurement of the pressure. A simplified circuit diagram of a conventional circuit for measuring a variable capacitor value is shown in FIG. 1. The variable capacitor $C_X$ is arranged as an input capacitor and coupled to a negative input of an operational amplifier 102. A reference capacitor $C_{REF}$ is used as a feedback capacitor coupled between an output and a negative input of the operational amplifier 102. The output voltage VOUT of the operational amplifier 102 is a function of the ratio $C_X/C_{REF}$. The input voltage VIN applied to the variable input capacitor $C_X$ has a rectangular waveform (i.e., it is typically a square wave signal). The output voltage VOUT is also square wave. VOUT is converted into a digital signal DOUT through an analog-to-digital converter or ADC 104. The amplitude of the digital signal DOUT is proportional to the capacitance of capacitor $C_X$. The absolute values of capacitors $C_{REF}$ and $C_X$ and many other parameters of the circuit have an influence on the amplitude of the output signal VOUT and therefore on the amplitude of digital signal DOUT. Other prior art solutions apply a square wave signal directly to the variable capacitor and convert the signal across the variable capacitor into a digital signal, which is evaluated for determining the pressure. Therefore, many prior art solutions require calibration before the system can be used. However, even after calibration, varying operating conditions can affect the measurement results, the precision, and the overall performance. Previous methods of determining the variable capacitance are therefore imprecise, complex, introduce large errors into the measurements, and cannot be performed over a wide range of values of the variable capacitances. Furthermore rectangular or square wave excitation is sensitive to parameter variations and rather limited in terms of frequency or bandwidth.

SUMMARY

A preferred embodiment of the present invention, accordingly, provides a electronic device for determining the value of a variable capacitance. The electronic device comprises a digital signal generator for providing a digital excitation signal and an analog filter for receiving the digital excitation signal and for providing a filtered signal. Further, there is an amplitude modulator comprising the variable capacitance. The amplitude modulator is adapted to receive the filtered signal and to provide an amplitude modulated signal having an amplitude which is a function of the capacitance value of the variable capacitance. There is also an analog-to-digital converter (ADC) adapted to convert the amplitude modulated signal received from the amplitude modulator into a digital amplitude modulated signal and a demodulator adapted to receive the digital an amplitude modulated signal and to provide a demodulated digital signal. The electronic device is adapted to operate the digital signal generator and the demodulator synchronously. Synchronous operation can be achieved by using synchronous clock signals for at least the demodulator and the digital signal exciter. The ADC may preferably also be operated synchronously to the demodulator and the digital excitation signal.

The digital signal generator can be a pulse width modulator, which is coupled to the analog filter. The analog filter can be a low pass filter, for example, for converting the pulses into a filtered signal. The filtered signal which is advantageously a sine wave signal, is then passed to the amplitude modulator, which comprises the variable capacitance. The amplitude modulator modulates the amplitude of the received filtered signal (e.g., the received sine wave signal) as a function of the capacitance value of the variable capacitor. In a pressure sensor, for example, the capacitance value of the variable capacitor would be a function of the pressure applied to the sensor. The output of the amplitude modulator is then coupled to an ADC for receiving the amplitude modulated signal. The output of ADC is coupled to the input of the demodulator.

In order to process the digital amplitude modulated signal in the demodulator synchronously with respect to the digital excitation signal, a clock signal generator can be coupled to the digital signal generator and the demodulator for providing synchronous clock signals. However, instead of two or more synchronous clock signals, the pulse width modulator and the demodulator can also be driven by a single clock signal. In this way, there is a fixed timing between the digital excitation signal input to the amplitude modulator and the demodulated output signal being the digital representation of the variable capacitance value. Due to synchronous processing of input and output signals, there is no need to apply complex algorithms for demodulating the signal and for extracting the immediate value of the variable capacitor from the continuous output signal of the amplitude modulator. This means that measurement of the value of the variable capacitance, and thus the pressure, for example, is highly simplified, more precise and can be performed over a wide range of values of the variable capacitance. in addition sine wave excitation instead of square waive excitation can advantageously be used, since the clock signals to the digital signal generator (e.g., the pulse width modulator) and the demodulator are synchronous. Thereby the processing within the two is also synchronous. Since the demodulation is performed digitally and synchronously to the excitation signal, the complexity required for demodulation is substantially reduced.

In accordance with a preferred embodiment of the present invention, the amplitude modulator can be adapted to modulate the amplitude of the filtered signal as a function of the ratio of the capacitance value of the variable capacitor and the capacitance value of a reference capacitor. Advantageously, the amplitude of the amplitude modulated signal can be modulated as a function of the difference of the capacitance values of the variable capacitor and the reference capacitor. Therefore, the influence of absolute capacitance values can basically be excluded from the measurement. Furthermore, the amplitude modulator can be adapted to modulate the amplitude according to the ratio of the difference of the capacitance value of the variable capacitance and a capacitance value of a reference capacitance to the sum of the capacitance value of the variable capacitance and the capacitate value of the reference capacitance. In this way, the output voltage is then basically a function of the input voltage multiplied by this ratio of the difference to the suns of the capacitances. This provides a very simple and precise way of determining the value of the variable capacitance. This provides not only that the measurement remains independent from the absolute value of the variable capacitance but also that other components of the amplitude modulator do not participate in the modulation procedure and do not interfere in the modulation. This relaxes the overall precision requirements on the circuit. The amplitude modulator may typically comprise a first amplifier and a second amplifier. Then the variable capacitance can be coupled to an output of the first amplifier and to a reference capacitance, and the reference capacitance can be coupled to an output of the second amplifier. The reference capacitance and the variable capacitance can be coupled to each other at a common node. There can be a third amplifier which is coupled with a first input to the common node, i.e. to the variable capacitance and to the reference capacitance. A second input of the third amplifier can be coupled to a reference voltage level. An output of the third amplifier can be coupled in a feedback connection to an input of the first amplifier and to an input of the second amplifier. The feedback connection may then be configured such that the first amplifier receives a difference signal at one input and the second input stage receives a summing signal at an input.

Advantageously, a minimum clock period of the clock signal used for generating the digital excitation signal can be substantially smaller, i.e. for example, at least ten times smaller, than a period of the filtered signal (e.g., a sinusoidal signal). In other words. the maximum frequency of the digital excitation signal should preferably be mulch higher than the basic frequency of the filtered signal, which is fed to the amplitude modulator. The analog filter can then be implemented with a low order and a high corner frequency with respect to the signal bandwidth or signal frequency of the filtered output signal. In an integrated implementation of the circuits according to a preferred embodiment of the present invention, this is important in terms of chip area. Analog filters with a high corner frequency and low complexity require much less chip area, which supports full integration on silicon.

In accordance with a preferred embodiment of the present invention, the digital signal generation and processing stage can be adapted to compensate a phase shift between the digital excitation signal (i.e., for example, the pulse width modulated signal) and the received digital amplitude modulated signal. Due to delays in the filter, the amplitude modulator and the ADC, a phase shift between the digital excitation signal and the digital an-amplitude modulated signal can be observed. The delay or phase shift can be compensated or at least determined for further processing of the received digital amplitude modulated signal. If the digital amplitude modulated signal is a periodic signal (e.g., a sine wave signal) with regular zero crossings, these zero crossings may be determined for determining the phase shift. The methods and the electronic device according to a preferred embodiment of the present invention are easy to implement, if the digital signal generation and processing stage, as well as the analog filter, are adapted to provide a sinusoidal filtered output signal. The amplitude modulated and digital amplitude modulated signals are then also sinusoidal signals. For a mere sine wave signal, the delay or phase shift will be almost constant and distortions due to imperfections of the circuits can be neglected.

A preferred embodiment of the present invention also provides a method for determining the capacitance value of a variable capacitance. The method comprises generating a pulse width modulated signal, filtering the pulse width modulated signal so as to receive a filtered signal, modulating the amplitude of the filtered signal by use of the variable capacitance for generating an amplitude modulated signal, sigma-delta modulating the amplitude modulated for receiving a sigma-delta modulated signal, and demodulating the digital sigma-delta modulated signal synchronously with a clock period of the pulse width modulated signal so as to receive a demodulated signal digitally representing a capacitance value of the variable capacitance.

Amplitude modulating the filtered signal may be performed according to a ratio of a difference of the capacitance value of the variable capacitance and a capacitance value of a reference capacitance to a sum of the capacitance value of the variable capacitance and the capacitance value of the reference capacitance. This provides a simple relationship between the input signal and the output signal, and the output signal can easily be determined in this case, since it will be equal to the input signal multiplied by the ratio of the difference to the sum of the capacitances. The amplitude of the output signal depends only on a simple ratio of the values of the variable capacitance and the reference capacitance. Therefore, the absolute values of the capacitances (reference and variable capacitance) and the properties of the additional components, such as resistances, are not required to be known.

The method may also comprise determining a phase shift between the pulse width modulated signal and the demodulated signal.

In accordance with another preferred embodiment of the present invention an apparatus is provided. The apparatus comprises a digital signal generator having a demodulator, wherein the digital signal generator provides a digital excitation signal; an analog filter that is coupled to the digital signal generator; an amplitude modulator having a variable capacitor, wherein the amplitude modulator is coupled to the analog filter, and wherein the amplitude modulator generates an amplitude modulated signal with an amplitude that is a function of the capacitance of the variable capacitor; and an analog-to-digital converter (ADC) that is coupled to the amplitude modulator and that is coupled to the demodulator, wherein the digital signal generator and the demodulator operate synchronously.

In accordance with a preferred embodiment of the present invention, the ADC comprises: a signal-delta, modulator that is coupled to the amplitude modulator; and a digital filter that is coupled between the sigma-delta modulator and the digital demodulator.

In accordance with a preferred embodiment of the present invention, the amplitude modulator further comprises: a reference capacitor that is coupled to the variable capacitor; a first amplifier that is coupled between the analog filter and the variable capacitor; and a second amplifier that is coupled between the analog filter and the reference capacitor, In accordance with a preferred embodiment of the present invention, the amplitude modulator further comprises: a second analog filter that is coupled to the node between the reference capacitor and the variable capacitor; and a third amplifier that is coupled to the filter.

In accordance with a preferred embodiment of the present invention, the digital excitation signal is a pulse width modulated signal and a period of a clock signal used for generating the pulse width modulated signal is at least ten times smaller than a period of a filtered signal output from the analog filter.

In accordance with a preferred embodiment of the present invention, a filtered signal output from the analog filter is a sinusoidal signal and the demodulator is adapted to multiply one-half of a period of a digital amplitude modulated signal received from the ADC by minus 1.

In accordance with a preferred embodiment of the present invention, an apparatus is provided. The apparatus comprises a digital signal generator; an analog filter that is coupled to the digital signal generator; an amplitude modulator including: a first network that is coupled to the analog filter; a first amplifier having a plurality of input terminals and an output terminal, wherein at least one of the input terminals of the first amplifier is coupled to the first network; a second amplifier having a plurality of input terminals and an output terminal, wherein at least one of the input terminals of the first amplifier is coupled to the first network; a variable capacitor that is coupled to the output terminal of the first amplifier; a reference capacitor that is coupled between the output terminal of the second capacitor and the variable capacitor; a third amplifier having a plurality of input terminals and an output terminal, wherein at least one of the input terminals of the third amplifier is coupled to the node between the variable capacitor and the reference capacitor, and wherein the output terminal of the third amplifier is coupled to the first network; and a second network that is coupled to the output terminal of the second amplifier and at least one of the input terminals of the second amplifier; and an ADC that is coupled to the amplitude modulator and to the digital signal generator.

In accordance with a preferred embodiment of the present invention, the amplitude modulator further comprises a second filter that is coupled between the third amplifier and the node between the variable capacitor and the reference capacitor.

In accordance with a preferred embodiment of the present invention, the second analog filter further comprise: a resistor coupled between the third amplifier and the node between the variable capacitor and the reference capacitor; and a filter capacitor that is coupled between the resistor and ground.

In accordance with a preferred embodiment of the present invention, the digital signal generator further comprises: a clock signal generator that is coupled to the ADC; a pulse width modulator (PWM) that is coupled to the clock generator and the analog filter; a digital demodulator that is coupled to the clock generator and the ADC.

In accordance with a preferred embodiment of the present invention, the ADC further comprises: a sigma-delta modulator that is coupled to the amplitude modulator; and a digital filter that is coupled to the sigma-delta modulator and the digital demodulator.

In accordance with a preferred embodiment of the present invention the first network further comprises: a first resistor that is coupled between the analog titter and at least one of the input terminals of the first amplifier; a second resistor that is coupled to between the first resistor and the output terminal of the first amplifier; a third resistor that is coupled between analog filter and at least one of the input terminals of the second amplifier; and a fourth resistor that is coupled between the third resistor and the output terminal of the third amplifier.

In accordance with a preferred embodiment of the present invention, the second network further comprises: a first resistor coupled between the output terminal of the second amplifier and at least one of the input terminals of the second amplifier; and a second resistor that is coupled between the first resistor and ground.

In accordance with a preferred embodiment of the present invention, an apparatus is provided. The apparatus comprises a clock signal generator; a PWM that is coupled to the clock generator; a digital demodulator that is coupled to the clock generator; an analog filter that is coupled to the PWM; a first resistor that is coupled to the analog filter; a second resistor that is coupled to the analog filter; a first amplifier having a first input terminal, a second input terminal, and an output terminal, wherein the first terminal of the first amplifier is coupled to the first resistor; a third resistor that is coupled between the first resistor and the output terminal of the first amplifier; a second amplifier having a first input terminal, a second input terminal, and an output terminal, wherein the first input terminal is coupled to the second resistor; a fourth resistor that is coupled between the output terminal of the second amplifier and the second input terminal of the second amplifier; a fifth resistor that is coupled between the fourth resistor and ground; a variable capacitor that is coupled to the output terminal of the first amplifier; a reference capacitor that is coupled between the output terminal of the second capacitor and the variable capacitor; a third amplifier having a first input terminal, a second input terminal, and an output terminal, wherein the first input terminal of the third amplifier is coupled to the node between the variable capacitor and the reference capacitor; a sixth resistor that is coupled between the output terminal of the third amplifier and the second resistor; a sigma-delta modulator that is coupled to the output terminal of the third amplifier; and a digital filter that is coupled to the sigma-delta modulator, the digital demodulator, and the clock generator.

In accordance with a preferred embodiment of the present invention, the apparatus further comprises: a seventh resistor coupled between the first input terminal of the third amplifier and the node between the variable capacitor and the reference capacitor; and a filter capacitor that is coupled between the seventh resistor and ground.

In accordance with a preferred embodiment of the present invention, the apparatus further comprises: a seventh resistor coupled between the output terminal of the third amplifier and the sigma-delta modulator; and a filter capacitor that is coupled between the seventh resistor and ground.

In accordance with a preferred embodiment of the present invention, the apparatus further comprises a seventh resistor that is coupled between the output of the third amplifier and the second input terminal of the second amplifier; and an eighth resistor that is coupled between the seventh resistor and ground.

In accordance with a preferred embodiment of the present invention, the apparatus further comprises: a seventh resistor that is coupled between the output terminal of the first amplifier and the node between the variable capacitor and the reference capacitor; and an eighth resistor that is coupled between the output terminal of the first amplifier and the node between the variable capacitor and the reference capacitor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
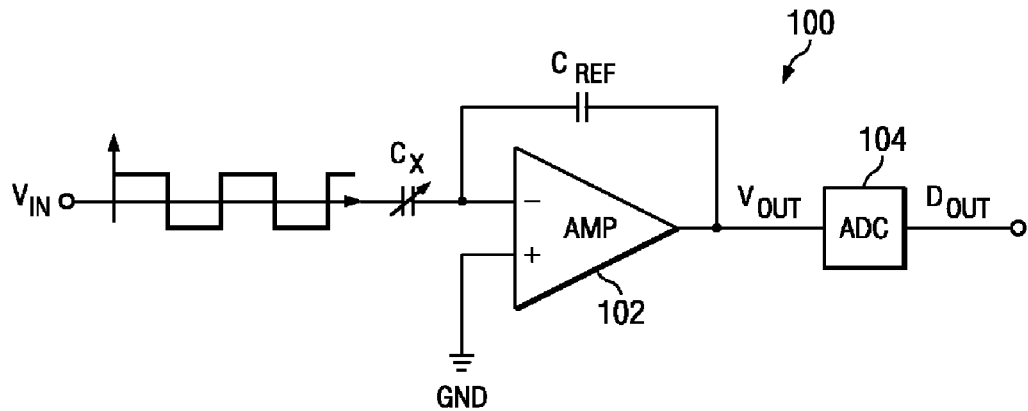
FIG. 1 illustrates a conventional circuit for determining a variable capacitance value.

Refer now to the drawings wherein depicted elements are, for the sake of clarity, not necessarily shown to scale and wherein like or similar elements are designated by the same reference numeral through the several views.

Figure 2:
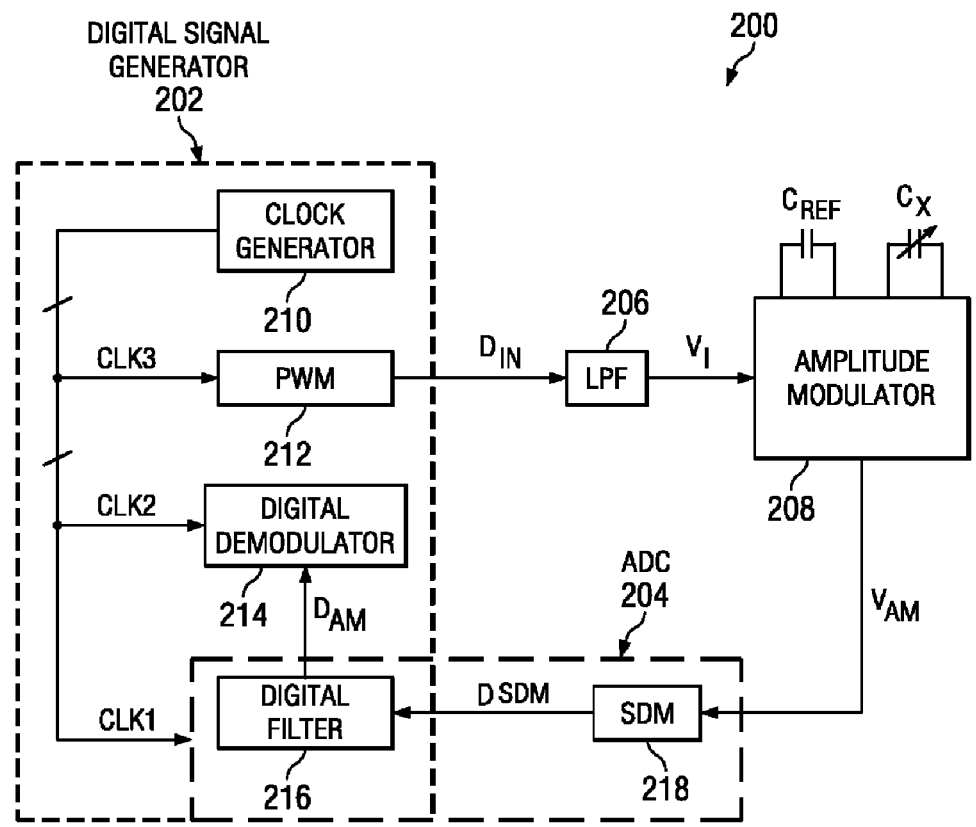
FIG. 2 is a simplified block diagram of an example of a circuit in accordance with a preferred embodiment of the present invention.

Referring to FIG. 2 of the drawings, the reference numeral 200 generally designates a circuit in accordance with a preferred embodiment of the present invention. The circuit 200 generally comprises a digital signal generator 202, an analog-to-digital converter (ADC) 204, a low pass filter (LPF) or analog filter 206, and an amplitude modulator 208. Additionally, the digital signal generator 202 generally comprises a clock generator 210, a pulse width modulator (PWM) 212, and a digital demodulator 214, while the ADC generally comprises a sigma-delta modulator 218 and a digital filter 216 (which may preferably serve as a post filtering stage, i.e., low pass and decimation for the sigma-delta modulator 218). The digital filter 216 can be arranged in the digital signal generator 202.

The digital signal generator 202 (i.e., in this case the PWM 212) operates as a, bit stream generating stage. The signal output by the PWM 212 is the digital excitation signal DIN for the amplitude modulator 208. Either the ADC 204 as a whole or, as in the present example, the digital filter 216 and the sigma-delta modulator 218 are all coupled to the clock generator 210, which is operable to generate synchronous clock signals CLK1, CLK2, CLK3 for driving the components of the digital signal generator 202. The clock signal CLK1 is fed to the ADC 204 (i.e., to the digital filter 216 and to the sigma-delta modulator 218), the clock signal CLK2 is fed to the digital demodulator 214, and the clock signal CLK3 is fed to the digital signal or bit stream generating PWM 212. The clock generator 210 is adapted such that the clock signals CLK1, CLK2 and CLK3 are all generated so as to be synchronous to each other. However, in an alternative configuration, the clock generator 210 may also just generate a single clock signal that is fed to all of the ADC 2041. (i.e., the digital filter 216 and the sigma-delta modulator 218), the digital demodulator 214, and the PWM 212. In other words, the digital filter 216, the digital demodulator 214, and the PWM 212 are generally driven synchronously to each other. A specific advantage of using a sigma-delta, modulator resides in the sampling rate due to over-sampling. Using an analog to digital converter with a comparably high sampling rate reduces the requirements for pre-filtering (anti-alias filter) and synchronous operation of the ADC 204 with the other stages.

The output of the PWM 212 is coupled to LPF 206. The LPF 206 is an analog filter. The output of the LPF 206 is coupled to the input of amplitude modulator 208. Amplitude modulator 208 generally comprises a variable capacitance $C_X$, which can be used as a pressure sensor, for example, and a reference capacitance $C_{REF}$. The output of the amplitude modulator 208 is coupled to ADC 204, e.g., sigma-delta modulator 218 in combination with the digital filter 216. The ADC 204 can also have a digital output (i.e., signal DAM), which is coupled to an input of the digital signal generator 202. The output of the sigma-delta modulator 218 can also be coupled to the input of the digital signal generator 202. In this embodiment, the digital filter 216 (e.g., LPF 206 and decimator for the sigma-delta modulator 218) can be integrated in the digital signal generator 202.

In operation, the digital signal generator 202, and in particular PWM 212, provides a digital excitation signal DIN that is generally comprised of digital pulses, such as a pulse width modulated signal, which is then output from the PWM 212. This digital signal DIN is then filtered by the LPF 206 in order to provide filtered signal VI. Filtered signal VI is fed to the amplitude modulator 208. After being filtered, the previously digital signal DIN output by digital signal generator 202 becomes an analog signal VI, e.g., a sinusoidal signal. The capacitance of the variable capacitance $C_X$ modulates the amplitude of the filtered signal VI. In other words, the filtered signal VI is modulated as function of the capacitance of the variable capacitance $C_X$. It is advantageous if the amplitude modulation is performed as a function of the ratio of the capacitance of variable capacitance $C_X$ and the capacitance of reference capacitor $C_{REF}$. This aspect will be explained in more detail below. The amplitude modulated signal VAM (e.g., an amplitude modulated sinusoidal signal) is then output from the amplitude modulator 208 and fed to ADC 204. The sigma-delta modulator 218 outputs a sigma-delta modulated signal DAM. The sigma-delta modulated signal DSDM is a digital signal (typically a high frequency bit stream of small bit width), which is then received at the digital filter 216, where a filtering and decimation step is performed. It is also generally possible to use different kinds of ADC 204, some of which may not require the digital filtering performed in digital filter 216. After having passed the digital filter 216 or if filtering is not necessary without passing the digital filter 216) the digital demodulator 214 receives the digital signal DAM and digitally demodulates the signal to provide a demodulated digital signal. The demodulation step can preferably be performed by simply multiplying the negative half wave of the sine signal by minus 1. This simple demodulation step is possible as the excitation signal VI is derived from a digital bit stream output by the PWM 212 which is synchronous to the received digital signal. Therefore, the demodulated signal can be a rectified sine signal. The demodulation stage may also be adapted to compensate for any phase shift between the pulse width modulated signal output from the PWM 212 and the sigma-delta modulated signal DSDM output from the sigma-delta modulator 218 or the signal DAM output from the ADC 204. The demodulated digital signal DAM represents the capacitance of the variable capacitor $C_X$. In order to determine the value of capacitor $C_X$, the demodulated signal DAM can, for example, be integrated over a period of the demodulated signal. However, being synchronous is less crucial in the integration step than during the demodulation step. Integrating a, rectified sine signal (or generally periodic signal) can be performed over any period of the signal regardless of the specific phase.

The digital excitation signal can preferably be a quantized pulse width modulated signal, which is composed of pulses of the same length (i.e. they all have the same clock period, such that the minimum clock period of the signal is defined by a single pulse). The pulses are arranged such that the LPF 206 can eliminate the pulses and provide a sine signal as the filtered signal VI by removing the high frequency content of the pulse signal.

Figure 3:
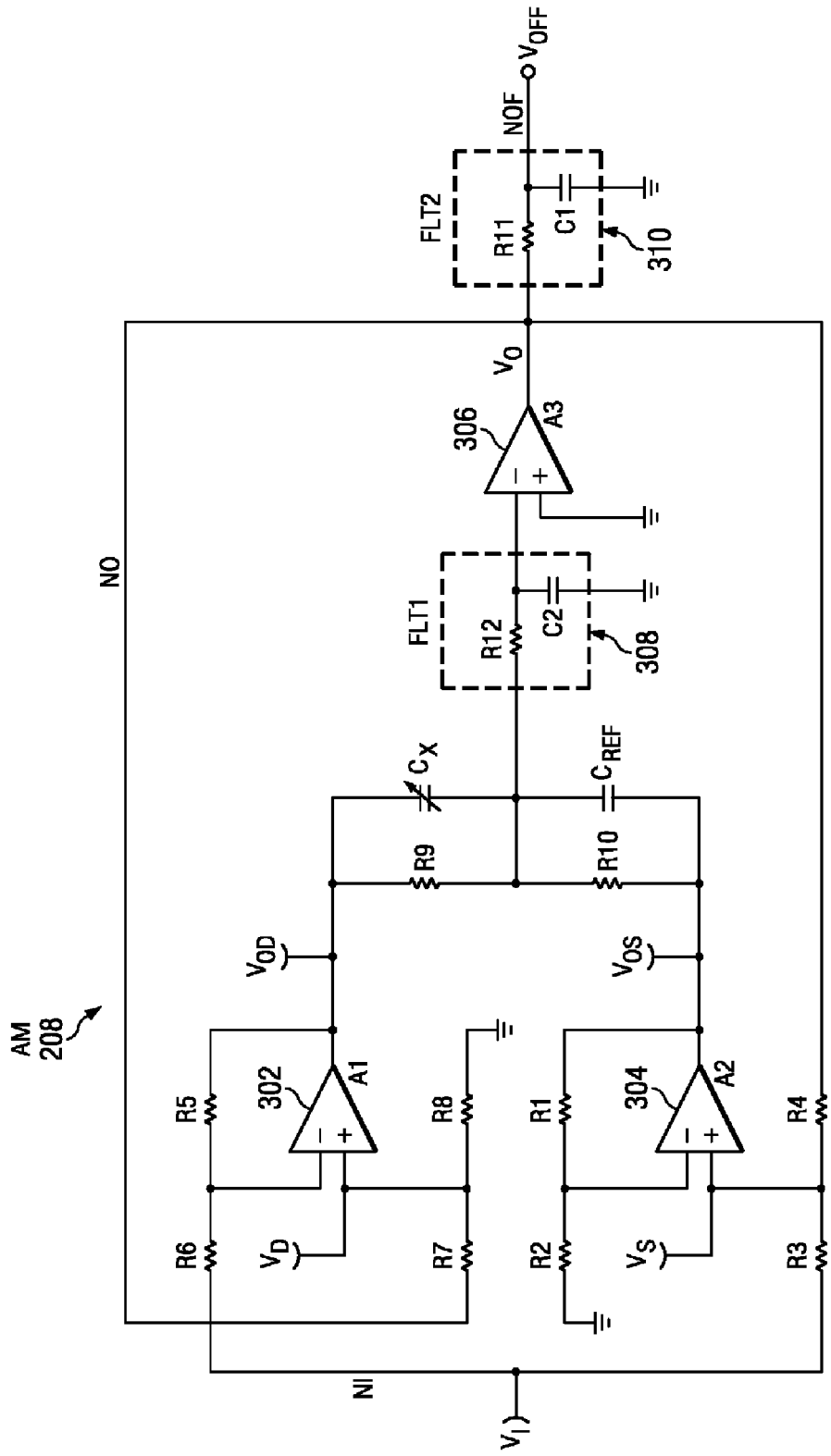
FIG. 3 is a simplified circuit diagram of an example of the amplitude modulator of FIG. 2.

Turning now to FIG. 3, amplitude modulator 208 can be seen in greater detail. The amplitude modulator 208 generally comprises amplifiers 302, 304, and 306, resistors R1 through R10, filters 308 and 310, and capacitors $C_X$ and $C_{REF}$. Resistors R3 through R8 generally comprises a network, while resistors R1 and R2 generally comprise another network. Variable capacitor $C_X$ and the reference capacitor $C_{REF}$ are coupled in series between the output terminals of the amplifiers 302 and 304. Amplifier 302 is operable to calculate the difference voltage VOD, which is provided at the output terminal of the amplifier 302. Amplifier 304 is operable to calculate the voltage sum VOS, which is provided at the output terminal of amplifier 304. A node interconnecting the capacitors $C_X$ and $C_{REF}$ is connected to the negative input terminal of amplifier 306. The output terminal of the amplifier 306 forms an output voltage node NO for providing the amplitude modulated signal VAM. Resistors R9 and R10 are coupled in parallel with the capacitors $C_X$ and $C_{REF}$ between the output terminals of amplifiers 302 and 304. The resistors R9 and R10 can serve as DC input bias current compensation of amplifier 306.

For measuring the capacitance of capacitor $C_X$, a sine wave input voltage VI is applied as an excitation signal. Sine wave excitation is possible as signal VI is derived from the digital bit stream DIN provided by the PWM 212. The input node NI is coupled to series-coupled resistor arrangements R5/R6 and R3/R4, with the resistor arrangement R3/R4 also being coupled to the output node VO, and the resistor arrangement R5/R6 being coupled to the output terminal of amplifier 302. A further series-coupled resistor arrangement of resistors R1 and R2 is coupled to the output terminal of amplifier 304. Another series-coupled resistor a arrangement of resistors R7 and R8 is coupled to the output node NO.

By use of resistors R4 and R7, the output node NO of the amplitude modulator 208 is fed back to the positive input terminals of amplifiers 302 and 304. This configuration provides that the output signal from node NO is a function of signal VI and the capacitances of capacitors $C_X$ and $C_{REF}$. The output signal VO from node NO is then basically independent from the absolute values of capacitances of capacitors $C_X$ and $C_{REF}$.

Figure 4:
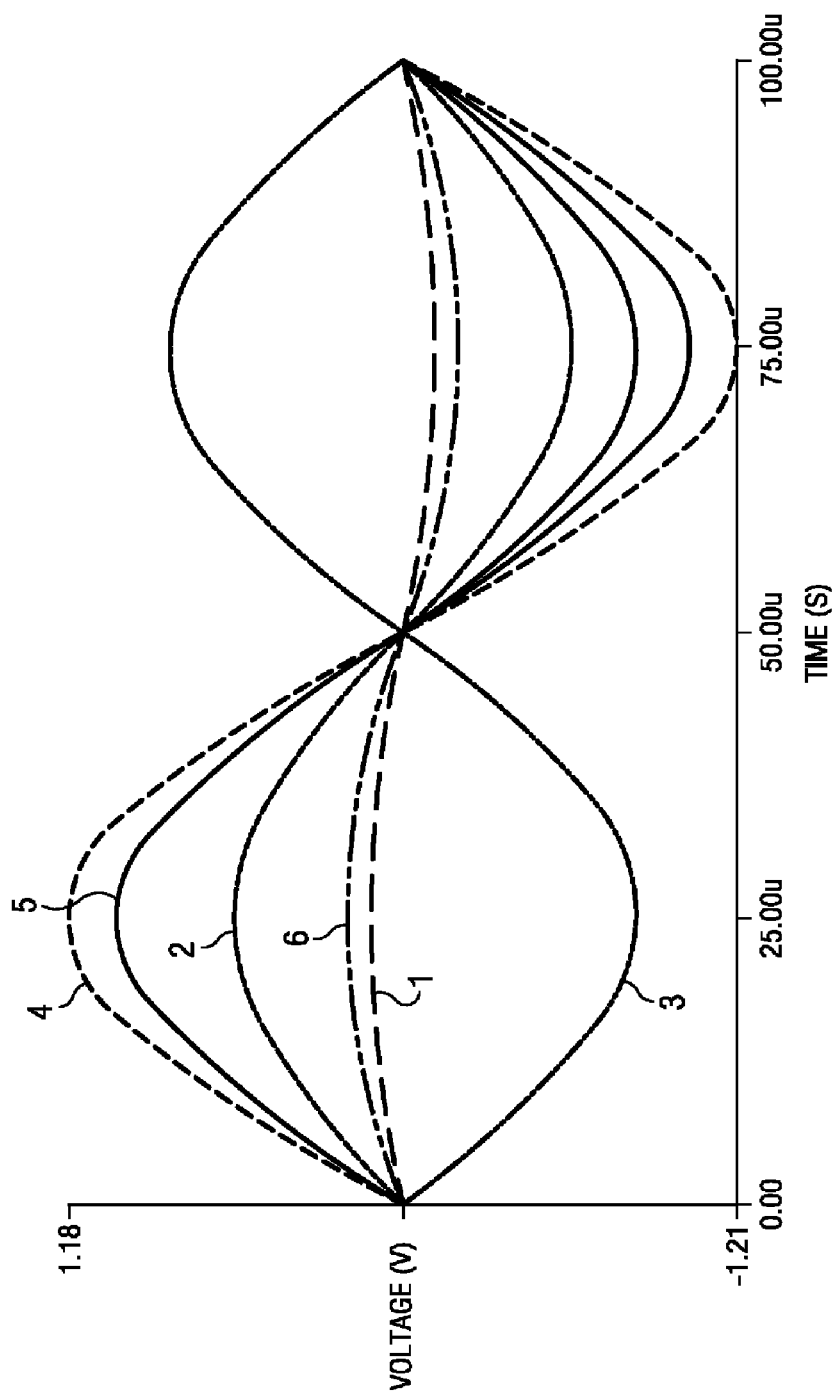
FIG. 4 is diagram depicting waveforms for the amplitude modulator of FIG. 2 and/or FIG. 3.

Referring now to FIG. 4, a, diagram of the sinusoidal waveforms relating to the amplitude modulator 208 can be seen. Waveform 1 represents the difference voltage Vd which is the difference between the voltage across the variable capacitor $C_X$ and the reference capacitor $C_{REF}$. Waveform 2 represents the voltage Vs, which is the sum of the voltages across both capacitors $C_X$ and $C_{REF}$. Waveform 3 represents VOD. Waveform 4 represents VOS. Waveform 5 represents the input signal VI at the input node NI, and waveform 6 represents the output signal at the output node VO. The relationship between the input signal VI at the input node NI and the output signal at the node NO is then given as follows:

$$VO = \frac{C_X - C_{REF}}{C_X - C_{REF}} V1. \quad (1)$$

Since the voltages VI and VO at the input and output nodes NI and NO are known, the ratio of the variable capacitance $C_X$ to the reference capacitance $C_{REF}$ can then be found. As the output voltage VO becomes zero for the capacitance of capacitors $C_X$ and $C_{REF}$ being equal. This aspect simplifies processing and determination of the capacitance of capacitor $C_X$.

Additionally, there are two filters 308 and 310, which can be included. Filter 308 generally comprises resistor R12 and capacitor C2; it is coupled to the negative input terminal of amplifier 306, which can stabilizes the outputs VOD and VOS of amplifiers 302 and 304. Filter 310 generally comprises resistor R11 and a capacitor C1; it is coupled to the output terminal of amplifier 306 to operate as a noise shaping filter for the output voltage VO of the circuit before it is applied to the output node NOF. If filter 310 is implemented, the output of the amplitude modulator 208 is node NOF rather then node NO, and node NOF is coupled to ADC 204 so as signal VAM indicated in FIG. 2.

Having thus described the present invention by reference to certain of its preferred embodiments. it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a digital signal generator having a digital demodulator, wherein the digital signal generator provides a digital excitation signal;
   an analog filter that is coupled to the digital signal generator;
   an amplitude modulator having a variable capacitor, wherein the amplitude modulator is coupled to the analog filter, and wherein the amplitude modulator generates an amplitude modulated signal with an amplitude that is a function of the capacitance of the variable capacitor; and
   an analog-to-digital converter (ADC) that is coupled to the amplitude modulator and to the digital demodulator, wherein the digital signal generator and the digital demodulator operate synchronously, and wherein a filtered signal output from the analog filter is a sinusoidal signal and the digital demodulator is adapted to multiply one-half of a period of a digital amplitude modulated signal received from the ADC by minus 1.

2. The apparatus of claim 1, wherein the ADC further comprises:
   a sigma-delta modulator that is coupled to the amplitude modulator; and
   a digital filter that is coupled between the sigma-delta modulator and the digital demodulator.

3. The apparatus of claim 1, wherein the amplitude modulator further comprises:
   a reference capacitor that is coupled to the variable capacitor;
   a first amplifier that is coupled between the analog filter and the variable capacitor; and
   a second amplifier that is coupled between the analog filter and the reference capacitor.

4. The apparatus of claim 3, wherein the analog filter further comprises a first analog filter, and wherein the amplitude modulator further comprises:
   a second analog filter that is coupled to the node between the reference capacitor and the variable capacitor; and
   a third amplifier that is coupled to the second analog filter.

5. The apparatus of claim 1, wherein the digital excitation signal is a pulse width modulated signal and a period of a clock signal used for generating the pulse width modulated signal is at least ten times smaller than a period of a filtered signal output from the analog filter.

6. An apparatus comprising:
a digital signal generator;
an analog filter that is coupled to the digital signal generator;
an amplitude modulator including:
a first impedance network that is coupled to the analog filter;
a first amplifier having a plurality of input terminals and an output terminal, wherein at least one of the input terminals of the first amplifier is coupled to the first impedance network;
a second amplifier having a plurality of input terminals and an output terminal, wherein at least one of the input terminals of the second amplifier is coupled to the first impedance network;
a variable capacitor that is coupled to the output terminal of the first amplifier;
a reference capacitor that is coupled between the output terminal of the second amplifier and the variable capacitor;
a third amplifier having a plurality of input terminals and an output terminal, wherein at least one of the input terminals of the third amplifier is coupled to the node between the variable capacitor and the reference capacitor, and wherein the output terminal of the third amplifier is coupled to the first impedance network; and
a second impedance network that is coupled to the output terminal of the second amplifier and at least one of the input terminals of the second amplifier; and
an ADC that is coupled to the amplitude modulator and to the digital signal generator.

7. The apparatus of claim 6, wherein the analog filter further comprises a first analog filter, and wherein the amplitude modulator further comprises a second analog filter that is coupled between the third amplifier and the node between the variable capacitor and the reference capacitor.

8. The apparatus of claim 7, wherein the second analog filter further comprises:
a resistor coupled between the third amplifier and the node between the variable capacitor and the reference capacitor; and
a filter capacitor that is coupled between the resistor and ground.

9. The apparatus of claim 6, wherein the digital signal generator further comprises:
a clock signal generator that is coupled to the ADC;
a pulse width modulator (PWM) that is coupled to the clock generator and the analog filter;
a digital demodulator that is coupled to the clock generator and the ADC.

10. The apparatus of claim 9, wherein the ADC further comprises:
a sigma-delta modulator that is coupled to the amplitude modulator; and
a digital filter that is coupled to the sigma-delta modulator and the digital demodulator.

11. The apparatus of claim 6, wherein the first impedance network further comprises:
a first resistor that is coupled between the analog filter and at least one of the input terminals of the first amplifier;
a second resistor that is coupled to between the first resistor and the output terminal of the first amplifier;
a third resistor that is coupled between analog filter and at least one of the input terminals of the second amplifier; and
a fourth resistor that is coupled between the third resistor and the output terminal of the third amplifier.

12. The apparatus of claim 6, wherein the second impedance network further comprises:
a first resistor coupled between the output terminal of the second amplifier and at least one of the input terminals of the second amplifier; and
a second resistor that is coupled between the first resistor and ground.

13. An apparatus comprising:
a clock signal generator;
a PWM that is coupled to the clock generator;
a digital demodulator that is coupled to the clock generator;
an analog filter that is coupled to the PWM;
a first resistor that is coupled to the analog filter;
a second resistor that is coupled to the analog filter;
a first amplifier having a first input terminal, a second input terminal, and an output terminal, wherein the first terminal of the first amplifier is coupled to the first resistor;
a third resistor that is coupled between the first resistor and the output terminal of the first amplifier;
a second amplifier having a first input terminal, a second input terminal, and an output terminal, wherein the first input terminal is coupled to the second resistor;
a fourth resistor that is coupled between the output terminal of the second amplifier and the second input terminal of the second amplifier;
a fifth resistor that is coupled between the fourth resistor and ground;
a variable capacitor that is coupled to the output terminal of the first amplifier;
a reference capacitor that is coupled between the output terminal of the second amplifier and the variable capacitor;
a third amplifier having a first input terminal, a second input terminal, and an output terminal, wherein the first input terminal of the third amplifier is coupled to the node between the variable capacitor and the reference capacitor;
a sixth resistor that is coupled between the output terminal of the third amplifier and the second resistor;
a sigma-delta modulator that is coupled to the output terminal of the third amplifier; and
a digital filter that is coupled to the sigma-delta modulator, the digital demodulator, and the clock generator.

14. The apparatus of claim 13, wherein the apparatus further comprises:
a seventh resistor coupled between the first input terminal of the third amplifier and the node between the variable capacitor and the reference capacitor; and
a filter capacitor that is coupled between the seventh resistor and ground.

15. The apparatus of claim 13, wherein the apparatus further comprises:
a seventh resistor coupled between the output terminal of the third amplifier and the sigma-delta modulator; and a filter capacitor that is coupled between the seventh resistor and ground.

16. The apparatus of claim 13, wherein the apparatus further comprises:
a seventh resistor that is coupled between the output of the third amplifier and the second input terminal of the first amplifier; and
an eighth resistor that is coupled between the seventh resistor and ground.

17. The apparatus of claim 13, wherein the apparatus further comprises:
a seventh resistor that is coupled between the output terminal of the second amplifier and the node between the variable capacitor and the reference capacitor; and
an eighth resistor that is coupled between the output terminal of the second amplifier and the node between the variable capacitor and the reference capacitor.

* * * * *